United States Patent [19]

Sirinyan et al.

[11] Patent Number: 5,200,272
[45] Date of Patent: Apr. 6, 1993

[54] PROCESS FOR METALLIZING SUBSTRATE SURFACES

[75] Inventors: Kirkor Sirinyan, Bergisch Gladbach; Reinhold Dederichs, Leverkusen; Rudolf Merten, Leverkusen; Ulrich von Gizycki, Leverkusen; Gerhard-Dieter Wolf, Dormagen, all of Fed. Rep. of Germany; John L. Williams, McMurray, Pa.

[73] Assignees: Miles Inc., Pittsburgh, Pa.; Bayer Aktiengesellschaft, Fed. Rep. of Germany

[21] Appl. No.: 922,592

[22] Filed: Jul. 30, 1992

Related U.S. Application Data

[63] Continuation of Ser. No. 342,763, Apr. 24, 1989, abandoned.

[30] Foreign Application Priority Data

Apr. 29, 1988 [DE] Fed. Rep. of Germany ....... 3814506

[51] Int. Cl.$^5$ .............................................. C23C 26/00
[52] U.S. Cl. ................................... 428/458; 427/304; 427/306; 427/404
[58] Field of Search ...................... 427/304, 306, 404; 428/458

[56] References Cited

U.S. PATENT DOCUMENTS

| | | | |
|---|---|---|---|
| 3,554,880 | 1/1971 | Jenkin | 204/30 |
| 3,560,257 | 2/1971 | Schneble | 117/212 |
| 3,993,807 | 11/1976 | Stabenow | 427/229 |
| 4,017,265 | 4/1977 | Taylor | 428/675 |
| 4,248,632 | 2/1981 | Ehrich | 106/1.11 |
| 4,325,991 | 4/1982 | Donovan | 427/306 |
| 4,368,281 | 1/1983 | Brummett | 427/98 |
| 4,575,467 | 3/1986 | Sirinyan | 427/304 |
| 4,578,310 | 3/1986 | Hatfield | 428/334 |
| 4,755,394 | 7/1988 | Aoki | 427/306 |
| 4,764,401 | 8/1988 | Sirinyan | 427/304 |
| 4,832,989 | 5/1989 | Giesecke | 427/304 |
| 4,910,045 | 3/1990 | Giesecke | 427/304 |

FOREIGN PATENT DOCUMENTS

| | | | |
|---|---|---|---|
| 1169720 | 6/1984 | Canada . | |
| 243794 | 11/1987 | European Pat. Off. | 427/304 |
| 340513 | 11/1989 | European Pat. Off. | 427/404 |
| 2503317 | 7/1976 | Fed. Rep. of Germany . | |
| 3627256 | 2/1988 | Fed. Rep. of Germany . | |
| 7107441 | 2/1971 | Japan | 427/306 |
| 2256226 | 11/1987 | Japan | 427/304 |
| 1426462 | 2/1976 | United Kingdom . | |
| 1436309 | 5/1976 | United Kingdom . | |

*Primary Examiner*—Shrive Beck
*Assistant Examiner*—Vi Duong Dang
*Attorney, Agent, or Firm*—Joseph C. Gil; Thomas W. Roy

[57] ABSTRACT

An improved process for depositing strongly adhering metallic coatings on substrate surfaces by wet chemical methods by treating the surfaces with a primer before activation.

The materials produced by the process are eminently suitable for the shielding of electromagnetic waves.

12 Claims, No Drawings

PROCESS FOR METALLIZING SUBSTRATE SURFACES

This application is a continuation, of application Ser. No. 07/342,763 filed Apr. 24, 1989 now abandoned.

BACKGROUND OF THE INVENTION

It is known that polymeric materials must be pretreated before chemical and subsequent electrolytic metallizing, for example by etching the polymer surface using chromic acids.

The polymer surface is altered during etching in such a way that caverns and vacuoles are formed. This is only possible with certain polymers, for example with 2-phase multi-component graft polymers or copolymers, such as ABS polymers, impact resistant polystyrene or 2-phase homopolymers, such as partially crystalline polypropylene.

Moreover, the application of chromic acid or other oxidants is associated with an impairment of the physical properties of the polymeric base material such as notched impact strength and electrical surface resistance.

Further, the hexavalent chromium which is drawn into the activation bath and into the metallizing bath causes these baths to be poisoned.

The same disadvantages are encountered in processes in which the polymer surface is chemically altered using a strong gaseous oxidant, for example hot $SO_3$ vapour.

The conventional processes for non-electrical metallization of materials usually comprise relatively many process steps and also have the disadvantage that they are limited to substrates which may be chemically or physically roughened due to their physical form or chemical structure.

EP-A 0,081,129 further discloses that an activation which produces strongly adhering metallic coatings is achieved by "swelling adhesion nucleation." This elegant process has the disadvantage however that it causes stress cracking in complex shaped polymeric injection mouldings. Further, this process requires a new swelling activation system for each type of plastic and thus is not universally applicable.

Finally, US-A 3,560,257 and 4,017,265 and also DE-A 3,627,256 disclose processes for activation, which use activator solutions containing adhesion promoting polymers. The disadvantage of these processes is that they require the use of relatively high concentrations of expensive precious metal activators.

An object of the present invention was thus to develop an economic process for chemical metallizing, by which material surfaces based on all commercial plastics can be given a strongly adhering metallic coating deposited by wet chemical methods without previous etching with oxidants.

The object can be achieved by coating the substrate surfaces with a primer based on a polymeric organic film former.

SUMMARY OF THE INVENTION

The present invention is directed to an improved process for depositing strongly adhering metallic coatings on substrate surfaces by wet chemical methods by treating the surfaces with a primer before activation.

DETAILED DESCRIPTION OF THE INVENTION

Activation of the plastic surfaces which are treated with a primer of this type may be carried out using not only inorganic, ionogenic and colloidal activation systems (see for example U.S. Pat. No. 3,554,880, DE-A 2,503,317 and DE-A 2,335,497) but also activation systems based on the complexes of palladium, gold and silver or platinum (see for example EP-A 0,081,129, DE-A 3,025,307, DE-A 2,116,389 and DE-A 2,451,217). Systems which are disclosed in EP-A 0,081,129 and EP-A 0,131,195 are particularly suitable for carrying out the process. A good anchoring of the activator on the substrate surface is achieved by the use of these activators. Functional groups which are particularly suitable for a chemical anchoring of the activator on the substrate surface include carboxylic acid groups, halogenocarboxylic acid groups, carboxylic acid anhydride groups, carbonyl ester groups, carbonamide groups and carbonimide groups, aldehyde groups and ketone groups, ether groups, sulphonamide groups, sulphonic acid groups and sulphonate groups, halogensulphonic acid groups, sulphonic ester groups, halogen-containing heterocyclic radicals, such as chloro-triazinyl groups, chloropyrazinyl groups, chloropyridinyl groups or chloroquinoxalinyl groups, activated double bonds, as in derivatives of vinylsulphonic acid or acrylic acid, amino groups, hydroxyl groups, isocyanate groups, olefin groups and acetylene groups and mercapto groups and epoxide groups, as well as higher chain alkyl radicals or alkenyl radicals having 8 or more carbon atoms, particularly oleyl groups, linoleyl groups, stearyl groups or palmityl groups.

It is preferred for those functional groups to be present on the particular primer surface to promote adsorption.

Functional groups such as carboxylic acid groups and carboxylic acid anhydride groups are particularly suitable for anchoring of the activator on the primer surface by adsorption.

The groups of the organic part of the organometallic compound which are necessary for bonding to the metal are known per se. They are for example C—C— or C—N— double bonds and triple bonds and groups which can form a chelate complex, for example OH—, SH—, —CO— or COOH groups.

The organometallic compound may be dissolved or dispersed in the organic solvent for example and the solvent may also be used to leach out the organometallic compound.

If the organometallic compound contains ligands, which allow chemical fixing on the substrate surface, activation from the aqueous phase may be possible.

The novel process according to the invention is generally carried out in the following way:

An organometallic compound of elements of subgroup 1 and 8 of the periodic table, particularly of Cu, Ag, Au, Pd and Pt having an additional functional group, is dissolved in an organic solvent. Mixtures of compounds can of course also be used. The concentration of the organometallic compound should be in the range of 0.01 g to 10 g per liter, but may in particular cases lie above or below this range.

Suitable organic solvents are particularly polar, protic and aprotic solvents, such as methylene chloride, chloroform, 1,1,1-trichloroethane, trichloroethylene, perchloroethylene, acetone, methyl ethyl ketone, butanol, ethylene glycol and tetrahydrofuran.

Mixtures of the above solvents and fractions containing other solvents such as naphtha, ligroin, toluene, etc. may of course be used. The surfaces of the substrate which is to be metallized are wetted by these solutions in the process according to the invention, in which the period for reaction is preferably 1 second to 10 minutes. Here, processes such as the dipping of the substrate in the solutions or the spraying of the substrate surfaces with the activating solutions are particularly suitable. It is of course also possible using the novel process to apply the activating solutions by stamping or printing.

Suitable substrates for the process according to the invention are for example mouldings made from polyethylene, polypropylene, ABS plastics, epoxy resins, polyesters, polyamides, polyacrylonitriles, polyvinyl halides and particularly polycarbonates, polyphenylene oxides and polyimides as well as mixtures of these with one another or with other polymers (for example blends of ABS and polycarbonate) and graft polymers and copolymers.

The organic solvent is removed after wetting. Here, low boiling solvents are preferably removed by evaporation, for example under vacuum. Where higher boiling solvents are concerned, other processes are appropriate such as extraction with a solvent, in which the organometallic compounds are insoluble.

In this connection it may be explicitly mentioned, that by using primers according to the invention, swelling adhesion nucleation of the plastic is not necessary. Thus stress crack formation is avoided. The surfaces which are pretreated in this way may subsequently be sensitized by reduction. For this purpose, the reducing agents which are commonly used in electroplating may preferably be used, such as hydrazine hydrate, formaldehyde, hypophosphite or borane. Other reducing agents are of course possible. Preferably, the reduction is carried out in aqueous solution. Other solvents may also be used, however, such as alcohols, ethers and hydrocarbons. Suspensions or slurries of reducing agents may of course also be used.

The surfaces which have been activated in this way may be used directly for non-electrical metallizing. It may also be necessary however to clean the surfaces by rinsing away residual reducing agents.

In an embodiment of the process according to the invention which is quite particularly preferred, the reduction within the metallizing bath is also carried out by the reducing agent which is used for the non-electrical metallization. This procedure represents a simplification of non-electrical metallization. This quite simple embodiment comprises only three process stages: dipping of the substrate in the solution of the organic compound, evaporation of the solvent and dipping of the surfaces activated in this way into the metallizing bath (reduction and metallizing).

This embodiment is quite particularly suitable for nickel baths containing amine borane compounds or copper baths containing formalin.

Metallizing baths which are usable in the process according to the invention include preferably baths containing nickel salts, cobalt salts, copper salts, gold salts and silver salts or mixtures of these with one another or with iron salts. Metallizing baths of this kind are known within the technology of non-electrical metallization.

The process according to the invention has the advantage of facilitating a strongly adhering metallic deposit by subsequent selective non-electrical metallizing using only the primer surface without previous oxidative etching and/or swelling or treatment of the substrate surface with solvents containing polymer chains.

A further embodiment of the process according to the invention which is quite particularly preferred is one in which the activation-reduction mentioned is carried out using an ultrasound bath containing the reducing systems already mentioned.

By this measure, a selective depositing of the metal in subsequent metallizing baths confined only to the primer surface is achieved with 100% processing reliability. Ultrasound treatment may of course be given before or after the sensitizing procedure or during the depositing of the metal by wet chemical methods.

Film formers of the primer components include paint systems which dry or cure at room temperature as well as stoving paints.

The paint systems which may be used at room temperature are for example alkyd resins, unsaturated polyester resins, polyurethane resins, epoxy resins, modified fats and oils, polymers or copolymers based on vinyl chloride, vinyl ethers, vinyl esters, styrene, acrylic acid, acrylonitrile or acrylates, cellulose derivatives. Stoving paints include paint systems which cure at elevated temperature, for example polyurethanes made from polyethers having hydroxyl groups, from polyesters having hydroxyl groups or from polyacrylates having hydroxyl groups and stopped polyisocyanates, melamine resins made from etherified melamine-formaldehyde resins and polyethers having hydroxyl groups, polyesters having hydroxyl groups or polyacrylates having hydroxyl groups, epoxy resins made from polyepoxides and polycarboxylic acids, polyacrylates having carboxyl groups and polyesters having carboxyl groups, stoving paints made from polyester, polyester imides, polyester amide-imides, polyamide-imides, polyamides, polyhydantoins and polyparabanic acids. These stoving paints may as a rule be applied both as a powder and from solution.

Film formers based on polyurethane systems are particularly well suited for carrying out the process.

The following starting materials are used according to the invention for producing the film or matrix formers:

1. Aliphatic, cycloaliphatic, araliphatic, aromatic and heterocyclic polyisocyanates, as described for example by W. Siefken in Justus Liebigs Annalen der Chemie, 362, pp. 75-136, for example those of the formula

in which n=2 to 4, preferably 2 to 3 and

Q is an aliphatic hydrocarbon radical having 2 to 18, preferably 6 to 10 carbon atoms, a cycloaliphatic hydrocarbon radical having 4 to 15, preferably 5 to 10 carbon atoms, an aromatic hydrocarbon radical having 6 to 15, preferably 6 to 13 carbon atoms, or an araliphatic hydrocarbon radical having 8 to 15, preferably 8 to 13 carbon atoms for example those polyisocyanates, which are described in DE-OS 2,832,253, pp. 10 to 11, and U.S. Pat. No. 4,263,408, herein incorporated by reference. As a rule, the polyisocyanates which are technically easily accessible are particularly preferred, for example: 2,4-toluylene diisocyanate and 2,6-toluylene diisocyanate, and any mixtures of these isomers ("TDI") polyphenyl-polymethylene-polyisocyanates, as produced by aniline-formaldehyde condensation and subsequent reaction with phosgene ("crude MDI") and polyisocyanates having carbodiimide groups, urethane groups, allophanate groups, isocyanurate groups, urea groups or biuret groups ("modified polyisocyanates"), particularly those modified polyisocyanates, which are derived from 2,4-toluylene diisocyanate and/or 2,6-toluylene diisocyanate or from 4,4'-diphenylmethane diisocyanate and/or 2,4'-diphenylmethane diisocyanate.

2. Compounds having at least two hydrogen atoms which are reactive towards isocyanates and are as a rule in the molecular weight range of 400 to 10,000. These are understood to include not only compounds having amino groups, thiol groups or carboxyl groups, but particularly compounds having two to eight hydroxyl groups, especially those in the molecular weight range 1,000 to 6,000, preferably in the range 2,000 to 6,000, for example polycarbonates and polyester amides having at least two, as a rule two to eight, preferably however 2 to 6, hydroxyl groups, as are well known for the production of homogeneous and expanded polyurethanes and as are described for example in DE-OS 2,832,253, pp. 11-18, and U.S. Pat. No. 4,263,408, herein incorporated by reference.

3. If desired, compounds having at least two hydrogen atoms which are reactive towards isocyanates and having a molecular weight in the range 32 to 399. In this case also this is understood to include compounds having hydroxyl groups and/or amino groups and/or thiol groups and/or carboxyl groups, preferably compounds having hydroxyl groups and/or amino groups, which act as chain prolongation agents or crosslinking agents. These compounds have as a rule 2 to 8, preferably 2 to 4, hydrogen atoms which are reactive towards isocyanates. Examples of these are described in DE-OS 2,832,253, pp. 19-20, and in U.S. Pat. No. 4,263,408, herein incorporated by reference.

4. If desired, water and/or easily vapourizable organic substances as blowing agents.

5. If desired, aids and additives, such as a) catalysts according to prior art,
b) surface-active additives, such as emulsifiers and stabilizers,
c) reaction inhibitors, for example acid reactant materials such as hydrochloric acid or organic acid or organic acid halides, cell regulators—according to prior art—such as paraffins, fatty alcohols or dimethylpolysiloxanes, pigments or dyes and flame retardants according to prior art, for example tris-chloroethyl phosphate, tricresyl phosphate, also stabilizers to prevent the effects of ageing and weathering, plasticizers and substances acting as fungicides and bactericides.

These aids and additives which may be used if desired are described for example in DE-A 2,732,292, pp. 21-24 and in U.S. Pat. No. 4,248,930, herein incorporated by reference.

The primers may also contain additives. Additives include organic and/or organometallic polymeric or prepolymeric compounds having molecular weights in the range 100-1,000,000, preferably in the range 500-20,000 with a total surface tension in the range 45-70 mN/m, preferably in the range 45-60 mN/m, particularly preferably in the range 50-60 mN/m.

Examples which may be quoted are oligomeric polymethacrylic acid or polymethacrylates such as polybutylmethacrylate, polyethylmethacrylate, and polymethylmeth-acrylate, polyamides based on adipic acid, and hexamethylenediamine, polyethyleneamines, polyethyleneamides, types of polyester based on adipic acid, phthalic acid, butanediol, trimethylolpropane and polyacrylates such as polyethyl acrylate, and polybutyl acrylate, polyalcohols such as polyvinyl alcohol and mixtures of these with each other. Types of polyester having viscosities in the range 10,000-35,000 cP at 20° C. having a hydroxyl content in the range 5.5-0.15% or the isocyanate modified derivatives of these are also very suitable for carrying out the process. Polyamines based for example on ethylenediamine, propylenediamine and butylenediamine may also be used for carrying out the process.

Polymers based on oxazolines such as polyethyloxazoline may also be used to carry out the process, these being produced for example by cationic polymerization from methyl tosylate and methyloxazoline. Moreover, polymethyl-oxazoline, polypropyloxazoline and polybutyloxazoline are eminently suitable for carrying out the process. The concentration of these may be widely varied in the range 1.0 to 85% by weight, based on the drying mass of paint. In this case the range 5-50% by weight is particularly preferred and the range 10-35% by weight is more particularly preferred.

Finally, the primers may also contain fillers. Inorganic fillers include oxides of the elements Mn, Ti, Mg, Al, Bi, Cu, Ni and Si, and also silicates, bentonites, talc and whiting. The process is advantageously carried out however using those inorganic or organic fillers, the resistivity of which is preferably in the range $0.01-10^4$ ohm/cm. Conductive carbon black is the particularly preferred filler.

The concentration of filler can be varied widely in the range 0.5-50, preferably in the range 0.5-10 and most preferably in the range 0.5-7.5% by weight, based on the dry mass of paint.

The thickness of the layer of primer may be varied in the range 0.1-200 μm preferably however in the range 5-20 μm. It can be applied to the surfaces of the plastic by the customary methods such as printing, stamping and spraying. Here, it may be pointed out explicitly, that the primer should be free from metals which could have an activation effect such as Pd, Au, Ag, Pt, Cu, Ni and Ru as well as the salts or complexes of these.

The novel process thus facilitates the depositing of metal on the surfaces of polymeric materials in a manner which is economic with materials, environmentally benign, and economic. Materials metallized by the novel process are remarkable for exhibiting excellent shielding from electromagnetic waves. These materials are used in the electrical, automotive, electronic and household sector.

Some of the product names mentioned in the following examples are registered trademarks.

EXAMPLE 1

A 100×100 mm sized Bayblend sheet of the type T 45 MN (ABS containing polycarbonate) supplied by Bayer AG, 5090 Leverkusen 1, is coated on one side with a 10 μm thickness of primer, comprising 53.7 parts by weight Desmolac 4125 (polyurethane resin), 198 parts by weight of a solvent mixture, comprising toluene, diacetone alcohol and isopropanol (1:1:1); 14.7 parts by weight titanium dioxide; 5.4 parts talc; 5.4 parts by weight whiting of the type Millicarb supplied by Omya, 5000 Cologne, 7.2 parts by weight carbon black of the type Efwekoschwarz NC 18/2 as a 20% solution in butyl acetate supplied by Degussa AG, Frankfurt/Main; 6.6 parts by weight polyester having 4.3% OH groups of the type Desmophen 670 with a surface tension >45 mN/m, as a 20% solution in MEK (methyl ethyl ketone) and DAA (diacetone alcohol) (1:1); 9 parts by weight antisettling agent based on silicates, as a 10% dispersion in xylene supplied by Kronos Titan GmbH, 5090 Leverkusen 1, and dried for 45 minutes at 80° C.

Subsequently, this sheet is activated for 5 minutes in an activating solution comprising 0.7 g mesityl oxide palladium chloride and 1,000 ml isopropanol, is treated with ultrasound for 5 minutes in an ultrasound bath, comprising 10 g dimethylaminoborane, 1.0 g NaOH, at 30° C. and is then coppered at room temperature in a chemical coppering bath supplied by Shipley AG, for 30 minutes, washed with distilled water, and then conditioned for 30 minutes at 80° C.

A sheet is obtained, metallized on one side. This sheet has a shielding effect against electromagnetic waves. Since a metallic deposit is located only on the primer surface, despite activation by dipping and metallizing by dipping, additional insulation by conventional painting is unnecessary. The metallic coating adheres to the primer surface so well, that is passes not only the Tesa film test in accordance with DIN 53,151, but also the heat shock test with very good results.

Moreover, the metallic coating has a peel strength according to DIN 53,494 of 20 N/inch.

EXAMPLE 2

A 100×100 mm sized ABS sheet of the type PM 3 C supplied by Bayer AG, is given a coating of primer on one side as described in Example 1 and is then activated in an activating bath, comprising 0.7 g bis-benzonitrile palladium dichloride and 1,000 ml of distilled water, and sensitized in a bath, comprising 1,000 ml of ethanol, 9 g of dimethylaminoborane and 2 g of LiOH and subsequently subjected to ultrasound treatment in distilled water for 10 minutes at 30° C.

This sheet is then nickel-plated for 45 minutes in a chemical nickel-plating bath supplied by Blasberg AG, Solingen.

A plastic sheet is obtained which is shielded against electromagnetic waves and has very good metal adhesion. The metallic coating passes the grid test and the Tesa film test. The peel strength of the metallic coating is 15 N/inch.

EXAMPLE 3

A PPO (polyphenylene oxide)-PS (polystyrene) sheet of the tradename Nonyl supplied by General Electric is coated on one side with a primer, comprising 53.7 parts by weight of Desmolac 4125, 200 parts by weight of solvent mixture, comprising toluene, diacetone alcohol and isopropanol (1:1:1), 15 parts by weight of titanium dioxide, 6 parts by weight of talc, 8 parts by weight of carbon black of the type Efwekoschwarz NC 18/2 as a 20% solution in butyl acetate supplied by Degussa AG, 7 parts by weight of PEOX (poly-2-ethyl-2-oxazoline) supplied by Dow, as a 20% solution in MEK and 8 parts by weight of anti-settling agent based on silicates as a 10% dispersion in xylene supplied by Kronos Titan GmbH, 5090 Leverkusen 1, and dried for 45 minutes at 80° C.

Subsequently this sheet is activated for 5 minutes in an activating solution comprising 0.8 part by weight of 1,2-butadiene palladium dichloride and 1,000 parts by weight of 1,1,1-trichloroethane, dried in air, sensitized for 7.5 minutes at 40° C. in a bath comprising 7.0 parts by weight of dimethylaminoborane, 0.5 part by weight of NaOH (s) and 1,000 parts by weight of distilled water, and subsequently in the sheet is subjected to ultrasound treatment in distilled water.

The sheet which has been activated and sensitized in this manner is given a 1.0 μm thick Cu coating in a chemical coppering bath supplied by Schering AG, 1000 Berlin, over a period of 45 minutes.

A plastic sheet is obtained which is metallized on one side and has a very good metal adhesion.

This sheet has a good shielding effect against electromagnetic waves.

EXAMPLE 4

A sheet of Bayblend (ABS containing 65% polycarbonate supplied by Bayer AG) is given a coat of primer, as described in Example 3 and is then activated as described in Example 1, subjected to ultrasound treatment and then given a metallic coating. A sheet is obtained which has a good shielding effect against electromagnetic waves and a good metal adhesion.

EXAMPLE 5

A 100×100 mm sized ABS sheet is given robotically a coating on one side of primer, 15 μm thick, comprising 50 parts by weight of a 2 component PU system having polyol components: 88.7 parts by weight of a polyester polyol of molecular weight 2000 made from adipic acid, ethylene glycol and 1,4-dihydroxybutane (molar ratio of the diols 70:30), 8.0 parts by weight of ethylene glycol, 0.5 part by weight of water, 0.5 part by weight of triethylenediamine and 0.55 part by weight of a commercial polysiloxane stabilizer (stabilizer D 193 supplied by Dow Corning).

Polyisocyanate components:

90.0 parts by weight of an NCO prepolymer made from 65 parts by weight of 4,4'-diisocyanate diphenylmethane and 38 parts by weight of polyester diol used in the polyol components, 250 parts by weight of solvent mixture, comprising toluene, DAA (diacetone alcohol) and isopropanol (1:1:1), 15 parts by weight of whiting, 8 parts by weight of carbon black of the type Efwekoschwarz NC 18/2, as a 20% solution in butyl acetate supplied by Degussa AG and 10 parts by weight of polyester having 3.2% OH groups, Desmophen A 565 supplied by Bayer AG, with a surface tension >48 mN/m, as a 20% solution in MEK and DAA (1:1), and is then coppered as described in Example 1, conditioned for 20 minutes at 70° C. A plastic sheet is obtained which is shielded against electromagnetic waves and has good metal adhesion. The adhesion of the metallic coating is 20 N/inch.

EXAMPLE 6

A 100×100 mm sized polyvinyl chloride sheet is given a coating of primer 10 μm thick as described in Example 5 and is then activated with an activator comprising 0.8 g of pentanedione palladium(II) chloride and 900 ml of distilled water sensitized as described in Example 1 and metallized.

A sheet is obtained which is well shielded from electromagnetic waves and has very good metal adhesion.

It passes the heat shock test (conditioning for 2 hours at 80° C. and subsequent shock cooling to −30° C.), and the grid test.

The peel strength of the metallic coating is 18 N/inch.

What is claimed is:

1. A process for depositing a strongly adhering metallic coating on a substrate surface which comprises
   a) applying to said surface a primer composition comprising a film-forming organic polymer and a polymeric organic additive having a surface tension of 45 to 70 mM/m, wherein said additive comprises a member selected from the group consisting of polyesters, polyamides and polyoxazolines,
   b) wetting the primed surface prepared in a) with a solution of an organometallic compound based on an element from Group 1 or 8 of the periodic table,
   c) reducing the organometallic compound to the pure metal either during or prior to step d) and
   d) non-electrically metallizing the activated primed surface prepared in
   b) either in conjunction with or following step c) by the wet chemical method.

2. The process of claim 1 wherein said film-forming organic polymer comprises a polyurethane.

3. The process of claim 1 wherein said organometallic compound is based on an element comprising Cu, Au, Ag, Pt, Pd or Ru.

4. The process of claim 1 which comprises conducting step c) in an ultrasound bath.

5. The process of claim 1 wherein said primer composition additionally contains a filler.

6. The process of claim 5 wherein said filler comprises a member selected from the group consisting of silicates and conductive carbon blacks.

7. A substrate having a strongly adhering metallic coating which is prepared by a process which comprises
   a) applying to the surface of said substrate a primer composition comprising a film-forming organic polymer and a polymeric organic additive having a surface tension of 45 to 70 mN/m, wherein said additive comprises a member selected from the group consisting of polyesters, polyamides and polyoxazolines,
   b) wetting the primed surface prepared in a) with a solution of an organometallic compound based on an element from Group 1 or 8 of the periodic table,
   c) reducing the organometallic compound to the pure metal either during or prior to step d) and
   d) non-electrically metallizing the activated primed surface prepared in
   b) either in conjunction with or following step c) by the wet chemical method.

8. The substrate of claim 7 wherein said film-forming organic polymer comprises a polyurethane.

9. The substrate of claim 7 wherein said organometallic compound is based on an element comprising Cu, Au, Ag, Pt, Pd or Ru.

10. The substrate of claim 7 which comprises conducting step c) in an ultrasound bath.

11. The substrate of claim 7 wherein said primer composition additionally contains a filler.

12. The substrate of claim 11 wherein said filler comprises a member selected from the group consisting of silicates and conductive carbon blacks.

* * * * *